United States Patent
Oyama et al.

(10) Patent No.: US 7,354,525 B2
(45) Date of Patent: Apr. 8, 2008

(54) SPECIMEN SURFACE PROCESSING APPARATUS AND SURFACE PROCESSING METHOD

(75) Inventors: Masatoshi Oyama, Kudamatsu (JP);
Yoshiyuki Ohta, Kudamatsu (JP);
Tsuyoshi Yoshida, Hikari (JP);
Hironobu Kawahara, Kudamatsu (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 11/224,967

(22) Filed: Sep. 14, 2005

(65) Prior Publication Data

US 2006/0000804 A1   Jan. 5, 2006

Related U.S. Application Data

(62) Division of application No. 10/375,093, filed on Feb. 28, 2003.

(51) Int. Cl.
  *B44C 1/22*   (2006.01)
(52) U.S. Cl. ............................. 216/67; 216/37; 216/41; 216/44; 216/47; 216/49; 216/58; 156/643.1; 134/1.2; 134/1.3; 134/1.1; 438/706; 438/710; 438/714; 438/723; 438/725; 438/905; 438/907
(58) Field of Classification Search ................ 156/345; 216/37, 41; 438/706

See application file for complete search history.

(56) References Cited

U.S. PATENT DOCUMENTS

| 5,681,780 A | * | 10/1997 | Mihara et al. | ............... 438/700 |
| 6,743,733 B2 | * | 6/2004 | Kitsunai et al. | ............ 438/710 |
| 2001/0015175 A1 | | 8/2001 | Masuda et al. | |
| 2002/0123229 A1 | * | 9/2002 | Ono et al. | .................. 438/706 |

FOREIGN PATENT DOCUMENTS

| JP | 09129594 | 5/1997 |
| JP | 10335309 A | 12/1998 |
| JP | 11288920 | 10/1999 |

OTHER PUBLICATIONS

S. Wolf, Silicon Processing for the VLSI Era, vol. 1, p. 567, Lattice Press (1986).*

* cited by examiner

*Primary Examiner*—Duy-Vu N. Deo
*Assistant Examiner*—Maki Angadi
(74) *Attorney, Agent, or Firm*—Antonelli, Terry, Stout & Kraus, LLP.

(57) ABSTRACT

For a surface processing apparatus using a plasma, a mixed gas of a fluorine-containing gas and an oxygen gas is used as an ashing gas. A mixed gas of an oxygen gas and a fluorine-containing gas is introduced as an ashing gas. This allows the following steps to be carried out at the same time: removal of the silicon component left on the mask material surface and the mask material in the area including the cured mask layer and the like; and the removal of the carbon-based, and silicon-based deposits deposited on the inner wall of a vacuum chamber. In addition, the removal of the mask material is performed under low pressure, and in the subsequent step to a step using a mixed gas of a fluorine-containing gas and an oxygen gas, a plasma of only an oxygen gas is used. As a result, it becomes possible to reduce the damages (etching) to the film layer after etching.

10 Claims, 3 Drawing Sheets

PROCESSING CHAMBER INNER WALL INITIAL STATE

SAMPLE INITIAL STATE

PROCESSING CHAMBER INNER WALL AFTER SAMPLE ETCHING

AFTER SAMPLE ETCHING

PROCESSING CHAMBER INNER WALL CLEANING BY $O_2$ STEP+$CF_4$/$O_2$ STEP

ASHING BY $O_2$ STEP+$CF_4$/$O_2$ STEP

SPECIMEN SURFACE PROCESSING APPARATUS AND SURFACE PROCESSING METHOD

CROSS-REFERENCE TO RELATED APPLICATION

This application is a divisional application of U.S. application Ser. No. 10/375,093, filed Feb. 28, 2003, the contents of which are incorporated herein by reference.

FIELD OF THE INVENTION

The present invention relates to a surface processing apparatus and a surface processing method of a sample such as a semiconductor element. In particular, it relates to a surface processing apparatus and a surface processing method suitable for performing etching and ashing of the semiconductor surface using a plasma.

BACKGROUND OF THE INVENTION

In the semiconductor manufacture process, a plasma processing apparatus is widely used in the fine processing processes such as film deposition, etching, and ashing. The process by plasma processing performs a prescribed process in the following manner. A process gas introduced into a vacuum chamber (reactor) is transformed into a plasma by plasma generation means. The resulting plasma is allowed to react on the semiconductor wafer surface to perform a fine processing, and volatile reaction products are discharged.

The present invention covers the apparatus utilizing a plasma in general. Now, the prior art will be explained by taking as an example an apparatus called an ECR (Electron Cyclotron Resonance) system which is one of those apparatuses. This ECR system generates a plasma by microwave discharge in a vacuum chamber externally applied with a magnetic field. In order to accelerate ions incident on a sample, a bias voltage is applied to the sample.

The device configuration of a semiconductor element has become increasingly complicated in recent years, so that there are demands for an increase in speed of processing and a reduction in number of steps in the manufacturing process thereof. Namely, for a semiconductor integrated device, with a request for downsizing, for example, for a pitch between wirings of about 0.2 μm or less, the capacitance between neighboring wirings relatively increases at the wiring portion. If a conventional silicon dioxide film is used as an insulating material between wirings of such a device, it becomes impossible to enjoy benefits due to higher speed of a transistor resulting from downsizing. For this reason, a material with a low dielectric constant (k value) such as SiOC is employed as an interwiring insulating material.

The material with a low dielectric constant (k value) is mainly used in combination with copper as a wiring material, and formed by a process called dual damascene. This requires a step of etching processing of an insulating film. The dual damascene formation process includes a step of processing and transferring a trench profile into a porous insulating film using a hard mask, and imparting a prescribed profile to a sample having a hole profile processed in the previous step. Such a technology is disclosed, for example, in Japanese Patent Laid-open No. H 9(1997)-115878.

Further, a method for monitoring the processing state, and controlling the process is also adopted in the prior art. As the method for monitoring the processing state, and controlling the process, for example, there is known the method in which a reflected interference light from a processed wafer is monitored to terminate etching processing, disclosed in U.S. Pat. No. 5,658,418.

Still further, in the prior art, removal of the mask material is carried out by means of another vacuum chamber or device in the same apparatus after the completion of etching. For example, Japanese Patent Laid-open No. 2000-352827 discloses a technology for removing the etching residues and the resist surface cured layer by a wet processing.

In the prior art, removal of the mask material is carried out by means of another vacuum chamber or device in the same apparatus after the completion of etching. This results in an increase in number of steps, and accordingly, a reduction in total throughput, and requires another vacuum chamber (device).

Further, with a method for carrying out the removal of the mask material by only an oxygen plasma, it is difficult to remove a silicon component remaining on the surface, and the mask material including a cured mask layer. Now, a consideration will be given to the case where a prescribed pattern such as a trench 121 is formed to the position indicated by a dotted line in the resist formed on an insulating film 120 made of SiOC as the surface processing of a wafer as shown in FIG. 4. On the surface of the mask material after etching, there remains an area including a cured layer 124 of a resist resulting from heat input from a plasma. In the cured layer 124, Si in the insulating film 120 separated by etching is also deposited. With the method for carrying out the removal of the mask material only by an oxygen plasma, it is impossible to remove such a cured mask layer in the surface of the mask material. Further, a damaged portion 125 in the film layer also occurs.

SUMMARY OF THE INVENTION

It is an object of the present invention to solve the foregoing problems, and to provide surface processing apparatus and surface processing method for readily carrying out ashing and removal of a mask material in the same vacuum chamber.

It is another object of the present invention to provide surface processing apparatus and surface processing method for readily carrying out the removal of a silicon component left on the mask material surface after etching and the mask material in the area including the cured mask layer and the like, and causing less damages to the film layer after etching.

It is a still other object of the present invention to provide surface processing apparatus and surface processing method for readily carrying out the removal of the mask material, and also carrying out the removal of carbon-based and silicon-based deposits deposited on the inner wall of a vacuum chamber upon etching.

In accordance with one aspect of the present invention, a sample surface processing apparatus comprises: a vacuum chamber; means for generating a plasma in the vacuum chamber; a sample stage for mounting a sample to be surface processed by the plasma thereon; and a power source for applying a high frequency bias to the sample, wherein the surface processing of the sample is performed by the plasma. The apparatus further comprises a function of monitoring the plasma emission intensity of a reaction product in the vacuum chamber, and the changes in interference light, automatically determining the state of the surface processing based on the monitor result, and controlling the high frequency bias.

In accordance with the present invention, it is possible to accomplish etching and ashing by the use of the same vacuum chamber.

In accordance with another aspect of the present invention, a sample surface processing apparatus for performing surface processing of a sample comprises: a vacuum chamber; means for generating a plasma therein; a sample stage for mounting the sample to be surface processed by the plasma thereon; and a power source for applying a high frequency bias to the sample. The apparatus further comprises means for introducing a mixed gas of an oxygen gas and a fluorine-containing gas as an ashing gas into the vacuum chamber.

In accordance with the present invention, a mixed gas of an oxygen gas and a fluorine-containing gas is introduced as an ashing gas, and subsequently, ashing is performed with a plasma using only an oxygen gas. As a result, it becomes possible to increase the selectivity between the mask material and a material to be etched. By the synergistic effects thereof, it is possible to accomplish ashing of the mask material while preserving the shape of a pattern after etching as much as possible, with the high selectivity being kept.

In accordance with a still other aspect of the present invention, a sample surface processing method comprises: generating a plasma in a vacuum chamber, and applying a high frequency bias to a sample stage for mounting a sample thereon, for performing the surface processing of the sample, and the method is characterized in that a mixed gas of an oxygen gas and a fluorine-containing gas is introduced into the vacuum chamber to perform the surface processing of the sample by the plasma.

In accordance with the present invention, a mixed gas of an oxygen gas and a fluorine-containing gas is introduced as an ashing gas. This allows the following steps to be carried out at the same time: removal of the silicon component left on the mask material surface and the mask material in the area including the cured mask layer and the like; and the removal of the carbon-based, and silicon-based deposits deposited on the inner wall of the vacuum chamber. In addition, the removal of the mask material is performed under low pressure, and in the subsequent step to the step using a mixed gas of a fluorine-containing gas and an oxygen gas, a plasma of only an oxygen gas is used. As a result, it becomes possible to reduce the damages (etching) to the film layer after etching.

DETAILED DESCRIPTION OF THE PREFERRED EMBODIMENTS

Below, the present invention will be described by way of examples. First, a description will be given to the configuration of a plasma etching apparatus to which surface processing of a sample of the present invention is applied.

Figure 1:
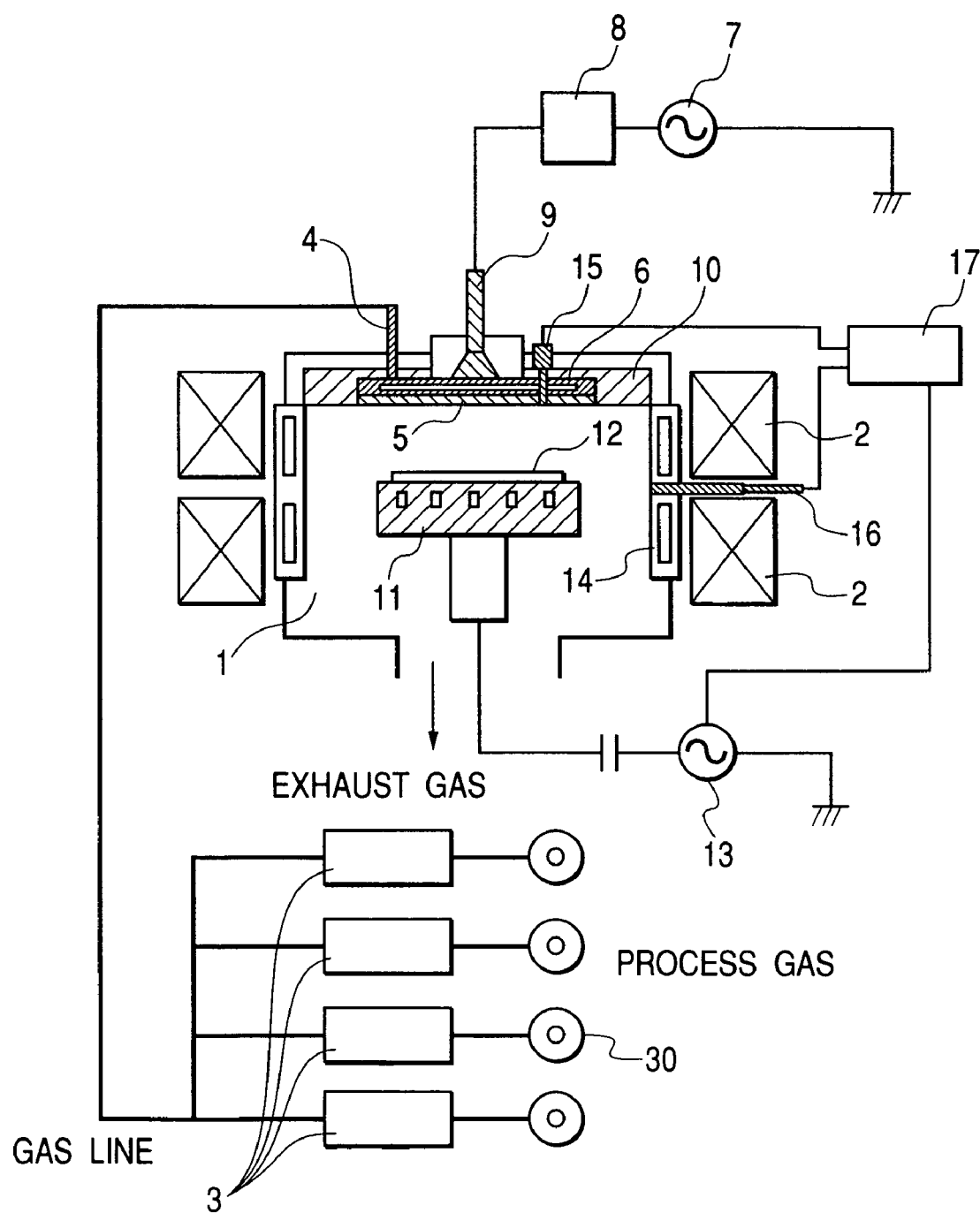
FIG. 1 is a schematic diagram showing an overall configuration of a plasma processing apparatus to which the present invention is applied.

FIG. 1 is a schematic diagram of a plasma processing apparatus applying electron cyclotron resonance (ECR), to which the present invention is suitably applicable. The plasma processing apparatus includes a plurality of processing chambers 1 which are vacuum chambers. Around each processing chamber 1, coils 2 are disposed in order to generate a magnetic field for electron cyclotron resonance (ECR). A gas for etching is supplied to each processing chamber 1 through a gas supply tube 4 connected to each gas source 30 via each mass flow controller 3. The etching gas is introduced from a gas supply plate 5 made of silicon or glassy carbon and provided with about several hundreds fine holes with a diameter of about 0.4 to 0.5 nm into each processing chamber 1. A disc-like antenna 6 for radiating a UHF band microwave is disposed above the gas supply plate 5. The microwave is fed from a power source 7 through a matching circuit 8 and a lead-in axis 9 to the antenna 6. The microwave is radiated from around the antenna 6, and the resonance electric field in the space above the antenna 6 is introduced into each processing chamber through a dielectric member 10. For the frequency of the microwave, the band capable of making the electron temperature of the plasma as low as 0.25 eV to 1 eV is selected, which falls within the range from 300 MHz to 1 GHz. In the examples, a frequency band in the vicinity of 450 MHz was used. Further, as the dielectric member 10, quartz or alumina can be used. Alternatively, a heat-resistant polymer with a low dielectric loss such as polyimide may also be used.

Under the gas supply plate 5, a wafer mounting electrode 11 is disposed, on which a wafer 12 is supported by electrostatic adsorption. A power source for electrostatic adsorption is not shown. A high frequency bias is applied from a high frequency power source 13 to the wafer mounting electrode 11 to draw ions in the plasma into the wafer 12.

The plasma emission intensity of a reaction product and the changes in interference light are observed by monitors 15 and 16, so that the end point is determined through a controller 17. Further, the plasma processing apparatus also includes an inspection unit for determining the line width or the like of the wafer processed by a critical dimension measurement SEM.

Incidentally, the controller 17 controls the overall plasma processing apparatus including the control of the mass flow controller 3, the power source 7, the high frequency power source 13, the inspection unit, and the like. The controller 17 is composed of a computer including, for example, a CPU, a memory, a program, an external memory, and an input/output unit. The wafers after processing are inspected for the conditions of the residue one by one by the inspection unit, so that the quality of each wafer is determined. The wafers rejected because of large residues thereon upon the inspection are eliminated, and are not fed to the subsequent processing step. On the other hand, also for the wafers identified as being acceptable as a result of the inspection, the inspection information is reflected in the subsequent processing step. For example, for the wafer which has been identified as being acceptable upon inspection, but has a relatively larger residue thereon, a correction processing with attention given to the residue is performed in the subsequent step.

Further, a display unit is included as the input/output unit of the controller 17, wherein the state of the residue of every wafer, the pass/fail results of the inspection, the current operation recipe, and the like are displayed.

Further, the antenna 6 and a processing chamber inner wall 14 are temperature controlled. Namely, a refrigerant is introduced form a thermoregulator not shown to the antenna 6 and the processing chamber inner wall 14 to control the temperature, so that the antenna 6 and the inner wall 14 are kept at a constant temperature. In the examples, the temperature was set so as to be controlled in the range of 30 to 80° C.

The vacuum chamber directly connected to the processing chamber 1 is equipped with a turbo-molecular pump with a pumping speed of about 2000 L/s to 3000 L/s. Further, although not shown, the opening of the turbo-molecular pump is equipped with a conductance valve for controlling the pumping speed, so that the pumping speed is controlled to achieve the flow rate and the pressure suitable for etching and ashing. Further, a stop valve is also disposed for isolating the turbo-molecular pump for air release or the like.

Next, a description will be given to etching and ashing using the plasma etching apparatus in the examples of the present invention.

To the processing chamber 1 in the evacuated state to a high vacuum, although not shown, a wafer is carried in by a carrier arm from a carrying chamber, and delivered onto the wafer mounting electrode 11. The carrier arm retreats, and the valve between the processing chamber 1 and the carrying chamber is closed. Then, the wafer mounting electrode 11 moves upward, and stops at a position suitable for etching and ashing. For the examples, the distance between the wafer 12 and the gas supply plate 5 (the distance between electrodes) is set at 30 nm to 100 nm.

First, a plasma is generated in the vacuum chamber by means of a plasma source to perform etching on the wafer. Then, ashing is performed in the same vacuum chamber to perform the removal of the mask material or the like.

The ashing in the examples of the present invention basically comprises the following two steps: first step and second step. The first step performs the removal of the upper layer of the wafer surface, i.e., the cured layer of the mask material surface and the Si-containing layer. The second step performs the removal of the lower layer of the wafer surface, i.e., the mask material. One example of the processing conditions of each step will be shown as follows.

EXAMPLE 1

(1) First Step:
  Ashing gas=Mixed gas of $O_2$ and $CF_4$
  Gas flow rate ($O_2/CF_4$)=100 sccm/5 sccm
  Processing pressure=0.5 Pa
  UHF microwave power source=Frequency 450 MHz, Output 400 W
  High frequency power source for wafer=Frequency 800 MHz, Output 300 W (2) Second Step
  Ashing gas=$O_2$ Single gas
  Gas flow rate ($O_2$)=100 sccm
  Processing pressure=0.5 Pa
  UHF microwave power source=Frequency 450 MHz, Output 400 W
  Output of high frequency power source for wafer=0 W In ashing, in either of the steps, the coils 2 were applied with a current to generate a resonance magnetic field of 0.016 T with a UHF microwave of 450 MHz between the gas supply plate 5 and the wafer mounting electrode 11 (i.e., the wafer 12). Then, the microwave power source 7 was operated. This accordingly results in generation of an intense plasma in an ECR area with a magnetic field intensity of 0.016 T due to electron cyclotron resonance.

For making uniform the ashing characteristics, it is necessary to achieve a uniform ion density incident on the surface of the wafer 12. However, the ECR position can be freely controlled by the magnetic field coils 2, and hence it is possible to obtain the optimum ion density distribution. In this example, the ECR area was formed in convex with respect to the wafer 12.

After ignition of the plasma, although not shown, a high voltage is applied from a DC power source connected in parallel to the high frequency power source 13 to the wafer mounting electrode 11, so that the wafer 12 is electrostatically adsorbed on the wafer mounting electrode 11. A helium gas is introduced to the back of the wafer 12 electrostatically adsorbed thereon. Thus, the wafer is temperature controlled through the helium gas between the wafer mounting side of the wafer mounting electrode 11 temperature controlled by a refrigerant and the wafer.

Then, the high frequency power source 13 is operated, so that a high frequency bias is applied to the wafer mounting electrode 11. As a result, ions are made vertically incident from the plasma upon the wafer 12. Simultaneously upon application of a bias voltage to the wafer 12, ashing is started. Ashing is terminated in a prescribed ashing time. Alternatively, the plasma emission intensity of the reaction product and the changes in interference light are observed by means of the monitors 15 and 16, so that the end point is determined through the controller 17 to determine the ashing completion time. Thus, appropriate overashing is carried out, and then ashing is completed. Ashing is completed when the application of a bias voltage from the high frequency power source 13 has been stopped through the controller 17. Simultaneously therewith, the supply of an ashing gas is also stopped.

When the thickness of the mask material is 300 nm to 400 nm, the processing time of the first step is 30 seconds, and the processing time of the second step is about 240 seconds. Switching between the first step and the second step may be properly accomplished by previously acquiring the data on the same processing conditions, and setting the irrespective times. Alternatively, the switching may also be accomplished automatically in the following manner. Namely, the changes in plasma emission intensity of the reaction product are monitored. Thus, the processing of the upper layer on the wafer surface is performed in the first step. Upon completion of the processing, the process shifts to the second step, wherein the lower layer on the wafer surface is processed.

By reference to FIGS. 2A to 2C, a description will be given to the state of surface processing of the wafer by etching and ashing in the examples of the present invention.

Figure 2A:
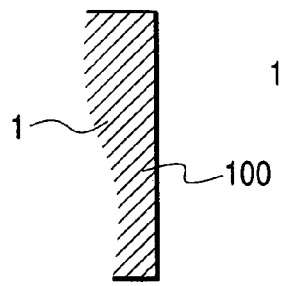
FIGS. 2A to 2C are diagrams respectively showing the states of the surface of a sample and the vacuum chamber inner wall in a processing method of the present invention.
Figure 2A:
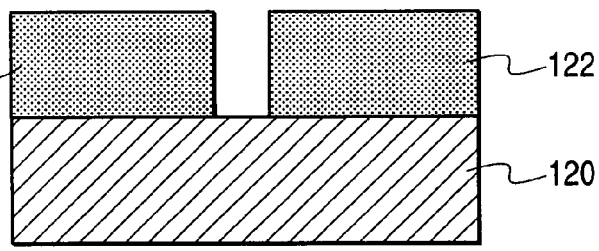
Figure 2B:
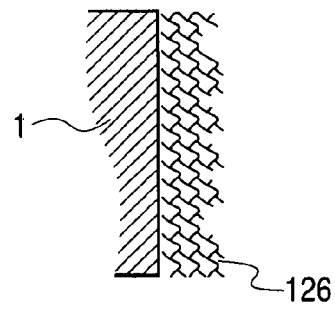
Figure 2B:
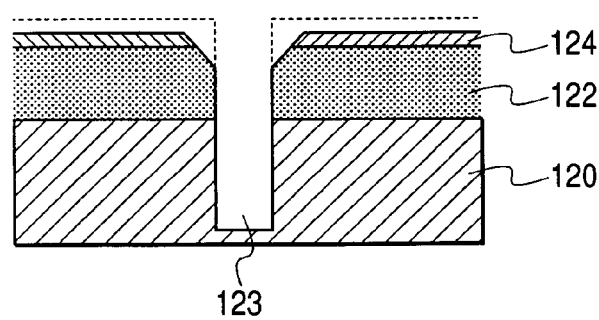
Figure 2C:
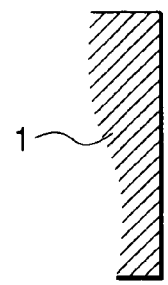
Figure 2C:
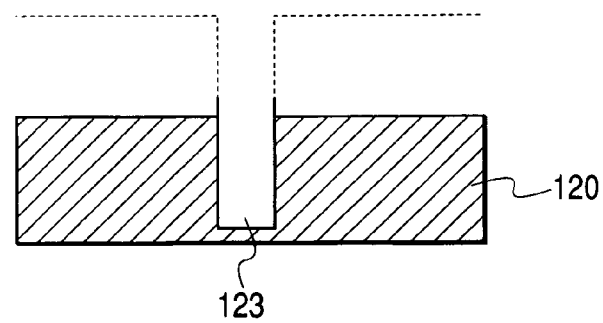

In the initial state of the wafer shown in FIG. 2A, the surface of the wafer 12 is so configured that a (C-, and H-containing) resist 122 for forming a prescribed pattern such as a trench 123 in the surface is formed on an insulating film 120 made of SiOC formed on the underlying film SiC. At this step, the inner wall surface 100 of the processing chamber 1 is in a clean state free from foreign matters such as reaction products attached thereto. After etching, as shown in FIG. 2B, a cured layer 124 of the resist resulting from heat input from the plasma is formed in the upper surface of the resist 122. Further, in the cured layer 124, Si in the insulating film 120 separated by etching is also deposited. Whereas, on the inner wall of the processing chamber 1, a deposition layer 126 of reaction products based on C which is the component of the resist and based on Si which is the component of a material to be etched is formed.

If ashing is carried out under the foregoing conditions, the selectivity between the mask material and the film layer after etching increases. For this reason, it is easy to remove the cured layer 124 in the surface of the unnecessary mask material. Namely, as shown in FIG. 2C, the cured layer 124 in the surface of the mask material is completely removed, and the deposition layer 126 on the inner wall of the processing chamber 1 is also completely removed.

Then, a step of desorbing the electrostatically adsorbed wafer 12 from the wafer mounting electrode 11 is required, wherein argon, a gas species actually used for ashing, or the like is used as an electric charge-removing gas. The supply of an electrostatic adsorption voltage is stopped, and an electric supply line is connected to a ground. Then, a charge removal time of about 10 seconds is set, while keeping the discharge of a microwave. As a result, the electric charges on the wafer 12 are removed away into the ground through the plasma, which allows the wafer 12 to be desorbed with ease. Upon completion of the electric charge removing step, the supply of the electric charge removing gas is stopped, and the supply of the microwave is also stepped. Further, the supply of a current to the coils 2 is also stopped. Whereas, the wafer mounting electrode 11 is moved downward to the height of the wafer delivery position.

Thereafter, the processing chamber 1 is evacuated to a high vacuum for some time. Upon completion of high vacuum evacuation, the valve between the carrying chambers is opened, and a carrier arm is inserted thereinto to receive the wafer 12, and to carry it out. For the subsequent etching, another wafer is carried in, and ashing is carried out in accordance with the foregoing procedure again. Up to this, the typical flow of the ashing process has been described.

One of the features of the present invention is that, as the conditions for ashing, the processing pressure is low, while the frequency of the UHF microwave power source is high. The removal of the mask material is carried out under low pressure. In addition, following the first step using a mixed gas of a fluorine-containing gas and an oxygen gas, the second step using a plasma of only an oxygen gas is carried out. As a result, it becomes possible to reduce the damages to the film layer after etching (side etching and etching of the trench bottom) Namely, the reduction in processing pressure and the increase in frequency of UHF microwave power source facilitate the control of oxygen radicals. As a result, it is possible to perform the removal of the hard mask material while reducing the damages to the film layer after etching.

Figure 3:
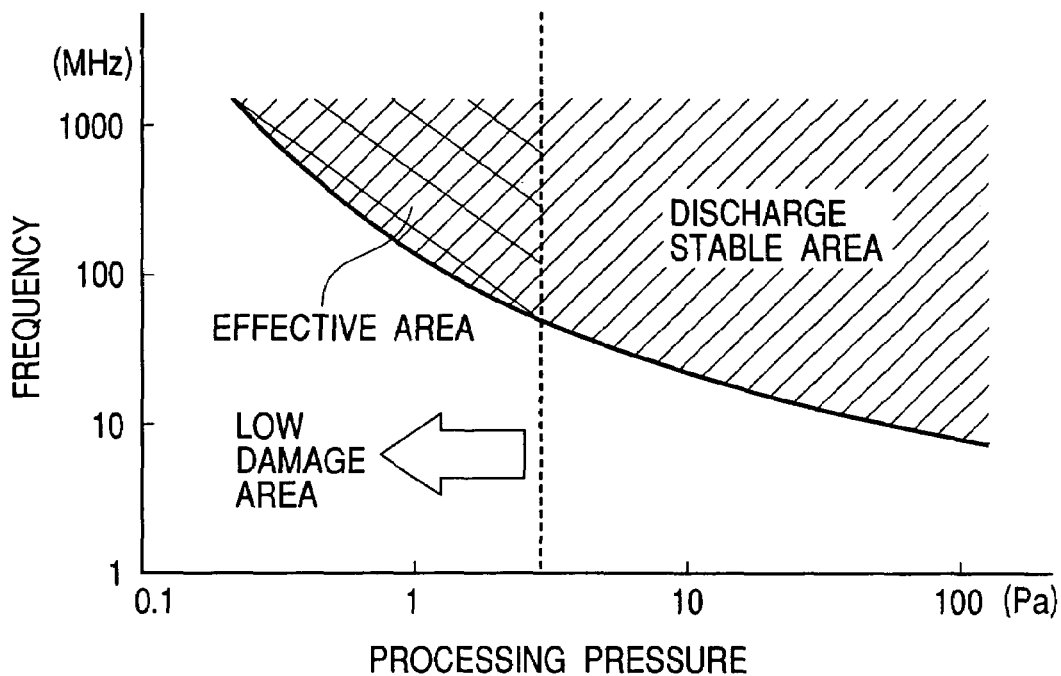
FIG. 3 is a diagram showing the desirable ranges of the processing pressure and the frequency of a power source in the method of the present invention.
Figure 4:
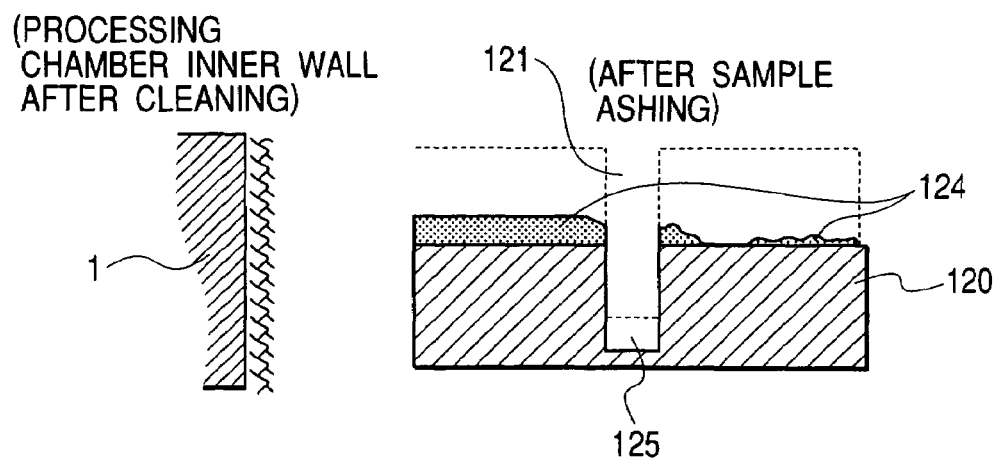
FIG. 4 is a diagram showing the states of the surface of a sample and the vacuum chamber inner wall in a prior art example.

FIG. 3 shows the desirable ranges of the processing pressure and the frequency of the power source in the method of the present invention.

In order to stabilize the discharge in the vacuum processing chamber, it is desirable that the relationship between the frequency of the power source and the processing pressure falls within the diagonally shaded area of FIG. 3. On the other hand, the processing pressure is desirably not more than 2 Pa from the viewpoint of reducing the damages to the film layer after etching. Namely, it is desirable that ashing is carried out within the scope of a processing pressure of 0.2 to 2 Pa, and a frequency of the UHF microwave of not less than 100 MHz, indicated as the "effective area" of FIG. 3.

Table 1 shows the characteristic processing conditions of one example of the present invention, and the comparative examples of effects in the case where the conditions are partly changed therefrom.

TABLE 1

| System | $O_2$ gas | $CF_4$ gas | Processing chamber pressure | Bias | Surface residue | Deterioration |
|---|---|---|---|---|---|---|
| 1 | Supplied | None | High pressure | None | Observed | Observed |
| 2 | Supplied | Supplied | High pressure | None | Si removed Cured layer left | Observed |
| 3 | Supplied | Supplied | Low pressure | None | Si removed Cured layer removed | Observed |
| 4 (present invention) | Supplied | (1) Supplied (2) None | Low pressure | (1) Applied (2) None | Same as above | None |

EXAMPLE 2

Ashing of a sample in which the thickness of the lower layer on the wafer surface, i.e., the mask material is 100 nm was carried out under the same conditions as those in Example 1, except that processing pressure was 2 Pa, UHF microwave power source had a frequency of 450 MHz, and an output of 400 W.

EXAMPLE 3

Ashing of the wafer surface and cleaning of the inner wall surface of the processing chamber 1 were simultaneously carried out under the same conditions as those in Example 1.

EXAMPLE 4

Cleaning of the inner wall surface of the processing chamber 1 was carried out under the same processing conditions as those in Example 1, so that the C-based, or Si-based reaction product was removed. This example 4 can be considered as a process for performing cleaning subsequent to the processing of a plurality of wafers under the conditions of Example 1.

Incidentally, the fluorine-containing gas to be supplied in the first step is preferably any of $CHF_3$, $CH_2F_2$, $CF_4$, and $SF_6$.

In accordance with the example of the present invention, with the surface processing apparatus using a plasma, a mixed gas of a fluorine-containing gas and an oxygen gas is used as an ashing gas. Use of a mixed gas of a fluorine-containing gas and an oxygen gas as an ashing gas allows the following steps to be carried out at the same time: removal of the silicon component left on the mask material surface and the mask material in the area including the cured mask layer and the like; and the removal of the carbon-based, and silicon-based deposits deposited on the inner wall of the vacuum chamber.

Further, the removal of the mask material is carried out under low pressure. In addition, in the subsequent step to the step using a mixed gas of a fluorine-containing gas and an oxygen gas, a plasma of only an oxygen gas is used. As a result, it becomes possible to reduce the damages to the film layer after etching (side etching and etching of trench bottom)

Incidentally, in these examples, a description has been given assuming that the UHF type ECR plasma etching apparatus is used. However, use of other plasma sources does not create any problem, and the plasma source to be used is not limited to the UHF type ECR plasma etching apparatus. Therefore, the present invention is applicable to even other induction type plasma apparatuses than the microwave type apparatus.

Further, a description was given to the case where etching and ashing are carried out in the same surface processing apparatus in accordance with the examples of the present invention. However, it is also acceptable that etching and ashing are separately carried out in different surface processing apparatuses.

As described above, in accordance with the present invention, it is possible to accomplish etching and ashing by the use of the same vacuum chamber. Further, the step using a fluorine-containing as an ashing additive gas, and the ashing step with an oxygen plasma are employed. This allows an increase in selectivity between the mask material and the material to be etched. By the synergistic effects thereof, it is possible to accomplish ashing of the mask material while preserving the shape of a pattern after etching as much as possible, with the high selectivity being kept.

What is claimed is:

1. A sample surface processing method comprising:
    etching a sample having a mask material on a surface thereof by
        generating a first plasma for etching the sample mounted on a sample stage provided in a vacuum chamber,
        applying a high frequency bias to the sample stage, and
    performing the surface processing of the sample on the sample stage by the first plasma, and then
        removing a cured layer of the mask material on the sample resulting from heat input from the first plasma in the same vacuum chamber in which the etching is performed by
        generating a second plasma of a mixed gas of an oxygen gas and a fluorine-containing gas introduced into the vacuum chamber,
        applying a high frequency bias to the sample and removing the cured layer of the mask material by the second plasma, and then
    ashing the sample in the same vacuum chamber in which the etching is performed by
        generating a third plasma of an oxygen gas introduced into the vacuum chamber,
        stopping the high frequency bias, and
        removing the mask material left after removal of the cured layer by the third plasma.

2. The sample surface processing method according to claim 1, wherein the pressure of the gas during the ashing is set at 0.2 to 2 Pa.

3. The sample surface processing method according to claim 1, wherein the fluorine-containing gas is preferably any of $CHF_3$, $CH_2F_2$, $CF_4$, and $SF_6$.

4. The sample surface processing method according to claim 1, wherein the removal of the mask material of the sample and removal of a deposit attached to the sidewall of the vacuum chamber are performed at the same time during ashing.

5. The sample surface processing method according to claim 1, wherein removal of a deposit attached to the inner wall of the vacuum chamber is performed during ashing.

6. A sample surface processing method by a sample processing apparatus comprising: a vacuum chamber; means for generating a plasma in the vacuum chamber; a sample stage provided in the vacuum chamber for mounting a sample to be processed thereon; and a power source for applying a high frequency bias to the sample, wherein the surface processing method comprises:
    etching a sample having a mask material on a surface thereof by
        generating a first plasma in the vacuum chamber,
        applying a high frequency bias to the sample stage, and
        performing the surface processing of the sample on the sample stage by the first plasma, and then
    performing ashing of the sample in the same vacuum chamber in which etching is performed to remove the mask material by
        generating a second plasma of a mixed gas of an oxygen gas and a fluorine-containing gas;
        applying a high frequency bias to the sample, and
        removing only a cured surface layer of the mask material of the sample resulting from heat input from the first plasma by the second plasma; and then
        generating a third plasma of an oxygen gas,
        stopping the high frequency bias, and
        performing the ashing by the third plasma for removing the mask material left after the removal of the cured surface layer
        monitoring the plasma emission intensity of a reaction product in the vacuum chamber, and the changes in interference light; and
        automatically determining the state of the surface processing based on the monitor result, and performing switching between supplying the oxygen gas and the mixed gas, and switching of the high frequency bias to the sample.

7. The sample surface processing method according to claim 6, wherein the pressure of the gas during ashing is set at 0.2 to 2 Pa.

8. The sample surface processing method according to claim 6, wherein the fluorine-containing gas is preferably any of $CHF_3$, $CH_2F_2$, $CF_4$, and $SF_6$.

9. The sample surface processing method according to claim 6, wherein the removal of the mask material of the sample and removal of a deposit attached to the sidewall of the vacuum chamber are performed at the same time during ashing.

10. The sample surface processing method according to claim 6, wherein removal of a deposit attached to the inner wall of the vacuum chamber is performed during ashing.

* * * * *